(12) United States Patent
Akiyama et al.

(10) Patent No.: US 9,418,837 B2
(45) Date of Patent: Aug. 16, 2016

(54) SEMICONDUCTOR DEVICE MANUFACTURING METHOD AND SUBSTRATE TREATMENT SYSTEM

(71) Applicant: TOKYO ELECTRON LIMITED, Tokyo (JP)

(72) Inventors: Koji Akiyama, Nirasaki (JP); Hirokazu Higashijima, Nirasaki (JP); Chihiro Tamura, Nirasaki (JP); Shintaro Aoyama, Nirasaki (JP); Yu Wamura, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/504,915

(22) Filed: Oct. 2, 2014

(65) Prior Publication Data

US 2015/0017813 A1    Jan. 15, 2015

Related U.S. Application Data

(63) Continuation of application No. PCT/JP2013/058805, filed on Mar. 26, 2013.

(30) Foreign Application Priority Data

Apr. 5, 2012  (JP) ................. 2012-086578

(51) Int. Cl.
| | |
|---|---|
| H01L 21/02 | (2006.01) |
| C23C 16/56 | (2006.01) |
| H01L 21/67 | (2006.01) |
| C23C 16/40 | (2006.01) |
| H01L 21/28 | (2006.01) |
| H01L 29/51 | (2006.01) |
| C23C 16/06 | (2006.01) |
| C23C 16/46 | (2006.01) |
| C23C 16/52 | (2006.01) |
| H01L 29/40 | (2006.01) |
| H01L 49/02 | (2006.01) |

(52) U.S. Cl.
CPC .......... *H01L 21/02356* (2013.01); *C23C 16/06* (2013.01); *C23C 16/405* (2013.01); *C23C 16/46* (2013.01); *C23C 16/52* (2013.01); *C23C 16/56* (2013.01); *H01L 21/022* (2013.01); *H01L 21/0234* (2013.01); *H01L 21/02181* (2013.01); *H01L 21/02189* (2013.01); *H01L 21/02194* (2013.01); *H01L 21/02332* (2013.01); *H01L 21/28158* (2013.01); *H01L 21/28185* (2013.01); *H01L 21/67109* (2013.01); *H01L 21/67115* (2013.01); *H01L 29/401* (2013.01); *H01L 29/517* (2013.01); *H01L 28/40* (2013.01)

(58) Field of Classification Search
None
See application file for complete search history.

(56) References Cited

U.S. PATENT DOCUMENTS

2005/0136690 A1    6/2005  Colombo et al.
(Continued)

FOREIGN PATENT DOCUMENTS

| JP | 2008186952 A | 8/2008 |
|---|---|---|
| JP | 2010153621 A | 7/2010 |

(Continued)

*Primary Examiner* — Alexander Ghyka
(74) *Attorney, Agent, or Firm* — Nath, Goldberg & Meyer; Jerald L. Meyer

(57) ABSTRACT

A semiconductor device manufacturing method that includes: forming a gate insulating film containing a hafnium oxide and a zirconium oxide on a workpiece having a source, a drain and a channel; and subjecting the gate insulating film to a crystallization heat treatment at a temperature of 600 degrees C. or less is provided. The gate insulating film subjected to the crystallization heat treatment has a relative permittivity of 27 or more.

7 Claims, 16 Drawing Sheets

(56) References Cited

U.S. PATENT DOCUMENTS

2011/0291160 A1* 12/2011 Ota et al. ............... 257/194
2012/0025287 A1* 2/2012 Golubovic ............. 257/298
2013/0260547 A1* 10/2013 Chung et al. .......... 438/585

FOREIGN PATENT DOCUMENTS

| JP | 2010192520 A | 9/2010 |
| JP | 2010535428 A | 11/2010 |
| JP | 2011066187 A | 3/2011 |

* cited by examiner

SEMICONDUCTOR DEVICE MANUFACTURING METHOD AND SUBSTRATE TREATMENT SYSTEM

CROSS-REFERENCE TO RELATED APPLICATION

This application is a Continuation application of PCT International Application No. PCT/JP2013/058805, filed Mar. 26, 2013, which claimed the benefit of priority from Japanese Patent Application No. 2012-086578 filed on Apr. 5, 2012, the entire disclosures of which are incorporated herein by reference.

TECHNICAL FIELD

The present disclosure relates to a semiconductor device manufacturing method and a substrate treatment system.

BACKGROUND

In recent years, along with the miniaturization of semiconductor devices and the demand for higher performance, a high permittivity film (high-K film) has been used as a gate insulating film. Hafnium oxide-based materials have drawn recent attention as being used as a gate insulating film. Attempts have been made to enhance the (relative) permittivity of material such as a hafnium oxide ($HfO_2$) and to reduce an equivalent oxide thickness (EOT).

As a method of increasing the relative permittivity of $HfO_2$, there is proposed, e.g., a method of thermally treating an $HfO_2$ film at a high temperature. However, the above proposed method suffers from a problem in that the $HfO_2$ is crystallized by the high temperature heat treatment and that a leak current is increased due to an electric conduction through a grain boundary thus generated.

Taking a semiconductor device manufacturing process into account, due to the heat load constraints in different processes, it is desirable that an insulating film having a high relative permittivity can be provided through the heat treatments performed over a wide temperature range.

In a transistor manufacturing process, e.g., a so-called gate last process in which a source/drain forming step and a channel forming step precede a gate insulating film forming step, heat load constraints are imposed on the source, the drain and the channel thus formed. This poses a problem in that the gate insulating film cannot be subjected to a heat treatment at a high temperature.

SUMMARY

The present disclosure provides a semiconductor device manufacturing method capable of enabling both the reduction of an EOT (equivalent oxide thickness) and the reduction of a leak current over a wide process temperature range.

According to one embodiment of the present disclosure, there is provided a semiconductor device manufacturing method. The method includes: forming a gate insulating film containing a hafnium oxide and a zirconium oxide on a workpiece having a source, a drain and a channel; and subjecting the insulation film to a crystallization heat treatment at a temperature of 600 degrees C. or less, the insulating film subjected to the crystallization heat treatment having a relative permittivity of 27 or more.

According to another embodiment of the present disclosure, there is provided a substrate treatment system. The system includes: a film-forming apparatus configured to form a gate insulating film containing a hafnium oxide and a zirconium oxide on a workpiece having a source, a drain and a channel; a crystallization heat treatment apparatus configured to subject the workpiece to a crystallization heat treatment; and a control unit configured to control the film-forming apparatus and the crystallization heat treatment apparatus. The control unit is configured to control the crystallization heat treatment apparatus so as to implement the crystallization heat treatment at a temperature of 600 degrees C. or less and configured to control the film-forming apparatus such that a content of the hafnium oxide in the insulating film becomes 5 mol % to 50 mol %.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

As a semiconductor device manufacturing method according to an embodiment of the present disclosure, a method for treating a silicon wafer as a workpiece will be described. In other words, description will be made on an example where a silicon wafer is treated and a gate insulating film is formed. However, the present disclosure is not limited thereto. For example, the semiconductor device manufacturing method of the present disclosure may be applied to a method for forming a capacitive insulating film of a capacitor (capacitor capacitive film) of a dynamic random access memory (DRAM).

An insulating film of a semiconductor device according to an embodiment of the present disclosure contains a zirconium oxide ($ZrO_2$) and a hafnium oxide ($HfO_2$). The content of an $HfO_2$ in the insulating film may be 5 mol % to 50 mol %. The film containing a $ZrO_2$ and an $HfO_2$ may be a hafnium zirconium oxide ($HfZrO_x$) film which is a mixed film of a $ZrO_2$ and an $HfO_2$ or may be a laminated film obtained by laminating a $ZrO_2$ and an $HfO_2$ at the aforementioned ratio. The insulating film thus obtained is crystallized by subjecting the same to a crystallization heat treatment (hereinafter, referred to as a "heat treatment"), whereby an insulating film having a high permittivity is obtained.

First Embodiment

Figure 1:
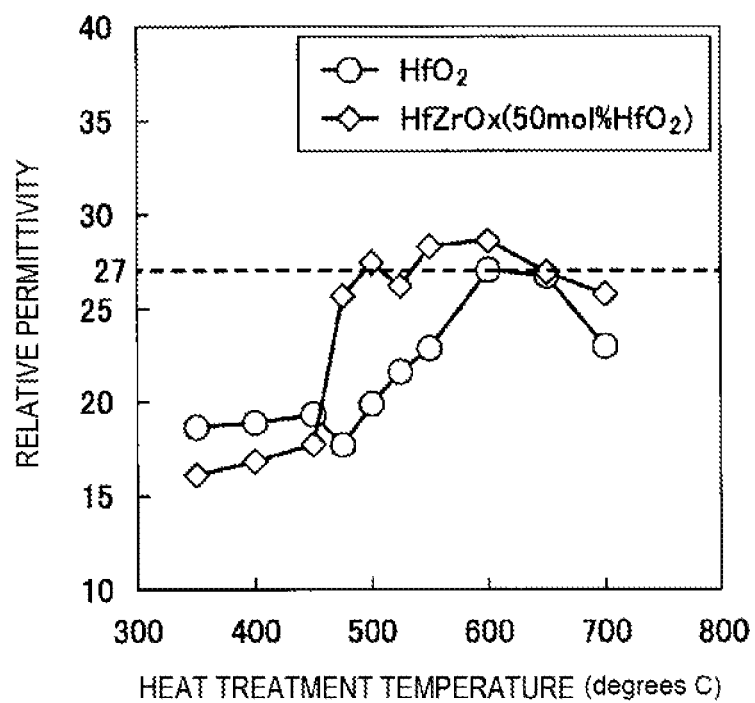
FIG. 1 is a view for explaining the effects of a semiconductor device according to an embodiment of the present disclosure and is a schematic diagram for explaining the relationship between a heat treatment temperature and a relative permittivity of a mixed insulating film.

FIG. 1 is a view for explaining the effects of a semiconductor device according to an embodiment of the present disclosure and is a schematic diagram for explaining the relationship between a heat treatment temperature and a relative permittivity of a mixed insulating film. In FIG. 1, the horizontal axis indicates a heat treatment temperature of the insulating film and the vertical axis indicates a relative permittivity of the insulating film.

As can be seen in FIG. 1, when subjected to a heat treatment at the same temperature, an $HfZrO_x$ film containing 50 mol % of an $HfO_2$ (a content of $HfO_2$ is 50 mol %) is higher in relative permittivity than an $HfO_2$ film.

For example, for the purpose of obtaining an insulating film having a relative permittivity k of 27, the $HfO_2$ film needs to be subjected to a heat treatment at about 600 degrees C. If the heat treatment temperature is not in the range of 600 degrees C., the relative permittivity sharply decreases. In general, for the sake of obtaining an $HfO_2$ film having a relative permittivity k of 27, a heat treatment needs to be carried out at 600 degrees C. to 650 degrees C. As shown in FIG. 1, the relative permittivity k of the insulating film ($HfZrO_x$ film) of the present embodiment becomes equal to or higher than 27 when the insulating film ($HfZrO_x$ film) is subjected to a heat treatment at about 470 degrees C. to about 600 degrees C. For that reason, in a process constrained to a heat load condition of, e.g., not less than 500 degrees C. and less than 600 degrees C., the relative permittivity k of 27 cannot be achieved by the $HfO_2$ film but can be achieved by the insulating film of the present embodiment. In other words, the insulating film of the present embodiment makes it possible to increase a relative permittivity through a heat treatment performed at a lower temperature and over a wide temperature range. Thus, the insulating film of the present embodiment can be applied to a process having a large heat load constraint and can widen a temperature margin of a process.

Figure 2:
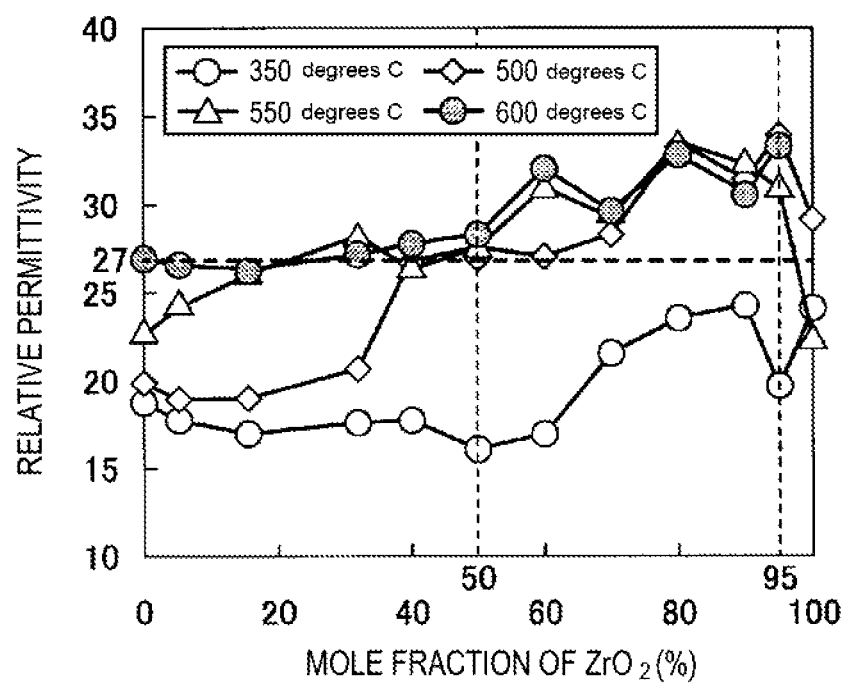
FIG. 2 is a view for explaining the effects of a semiconductor device according to an embodiment of the present disclosure and is a schematic diagram for explaining the relationship between a mole fraction of a $ZrO_2$ of a mixed insulating film and a relative permittivity.

FIG. 2 is another view for explaining the effects of a semiconductor device according to an embodiment of the present disclosure and is a schematic diagram for explaining the relationship between a mole fraction of a $ZrO_2$ of a mixed insulating film and a relative permittivity. In FIG. 2, the horizontal axis indicates a mole fraction of a $ZrO_2$ of an $HfZrO_x$ film, and the vertical axis indicates a relative permittivity of an $HfZrO_x$ film. In FIG. 2, for reference, a broken line indicates a relative permittivity k (=27) of an $HfO_2$ film subjected to a heat treatment at about 600 degrees C.

As shown in FIG. 2, the relative permittivity k of the insulating film of the present embodiment (containing 5 mol % to 50 mol % of $HfO_2$) has a value equal to or higher than 27 in a broad temperature range less than 600 degrees C. For that reason, the insulating film of the present embodiment makes it possible to increase a relative permittivity through a heat treatment performed at a lower temperature. Thus, the insulating film of the present embodiment can be applied to a process having a large heat load constraint and can widen a temperature margin of a process.

Figure 3:
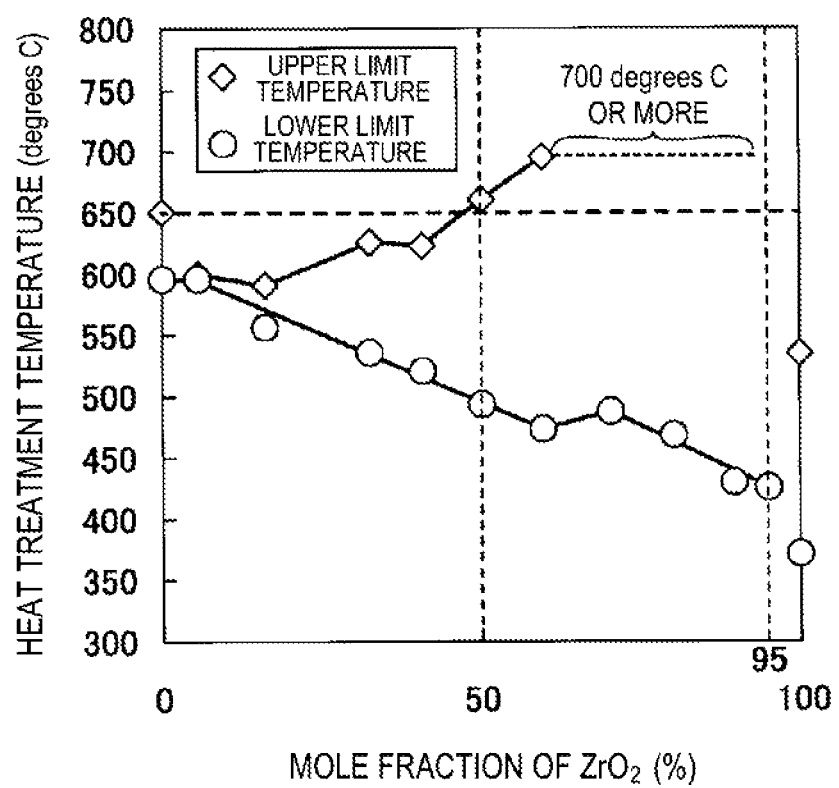
FIG. 3 is a view for explaining the effects of a semiconductor device according to an embodiment of the present invention and is a schematic diagram for explaining the relationship between a mole fraction of a $ZrO_2$ of a mixed insulating film and a heat treatment temperature.

FIG. 3 is another view for explaining the effects of a semiconductor device according to an embodiment of the present disclosure and is a schematic diagram for explaining the relationship between a mole fraction of a $ZrO_2$ of a mixed insulating film and a heat treatment temperature. In FIG. 3, the horizontal axis indicates a mole fraction of a $ZrO_2$ of an $HfZrO_x$ film, and the vertical axis indicates a heat treatment temperature. The plots shown in FIG. 3 indicate an upper limit value and a lower limit value of a heat treatment temperature at which the relative permittivity k becomes equal to or higher than 27. While the upper limit value was not measured in a region where the mole fraction of a $ZrO_2$ is 60 mol % or more and 95 mol % or less, it was confirmed that, up to 700 degrees C., the relative permittivity k is equal to or higher than 27.

It can be appreciated in FIG. 3 that the heat treatment temperature required in achieving a relative permittivity k of 27 grows lower as the mole fraction of a $ZrO_2$ in the insulating film becomes larger. Furthermore, a heat treatment temperature region where the relative permittivity k becomes equal to or higher than 27 grows significantly wider as the mole fraction of a $ZrO_2$ in the insulating film becomes larger. Particularly, in the insulating film of the present embodiment (containing an $HfO_2$ of 5 mol % to 50 mol %), a difference (temperature margin) between a heat treatment upper limit temperature and a heat treatment lower limit temperature for achieving a relative permittivity k of 27 is as large as about 150 degrees C. or more. Thus, if the composition of a $ZrO_2$ is adjusted depending on the upper limit temperature permitted in, e.g., a step of forming a gate of a semiconductor device, it is possible to form an insulating film having a high relative permittivity at a desired temperature.

In the insulating film of the present embodiment (containing an $HfO_2$ of 5 mol % to 50 mol %), the relative permittivity was not reduced even at a high heat treatment temperature of 700 degrees C. Accordingly, even when embodiments of the present disclosure are applied to a process in which a heat treatment is carried out at a higher temperature of 700 degrees C. or so, e.g., a gate first process, it is possible to prevent reduction of a relative permittivity.

The reason for the relative permittivity being reduced by the heat treatment carried out at a higher temperature than a normal temperature is that, due to the high temperature heat treatment, phase transformation from a cubic phase having a relatively high relative permittivity to a monoclinic phase having a low relative permittivity occurs and the monoclinic phase becomes dominant. It is presumed that eduction of the monoclinic phase could have been suppressed by adding a $ZrO_2$ to an $HfO_2$ (in other words, by adding an $HfO_2$ to a $ZrO_2$).

Figure 4:
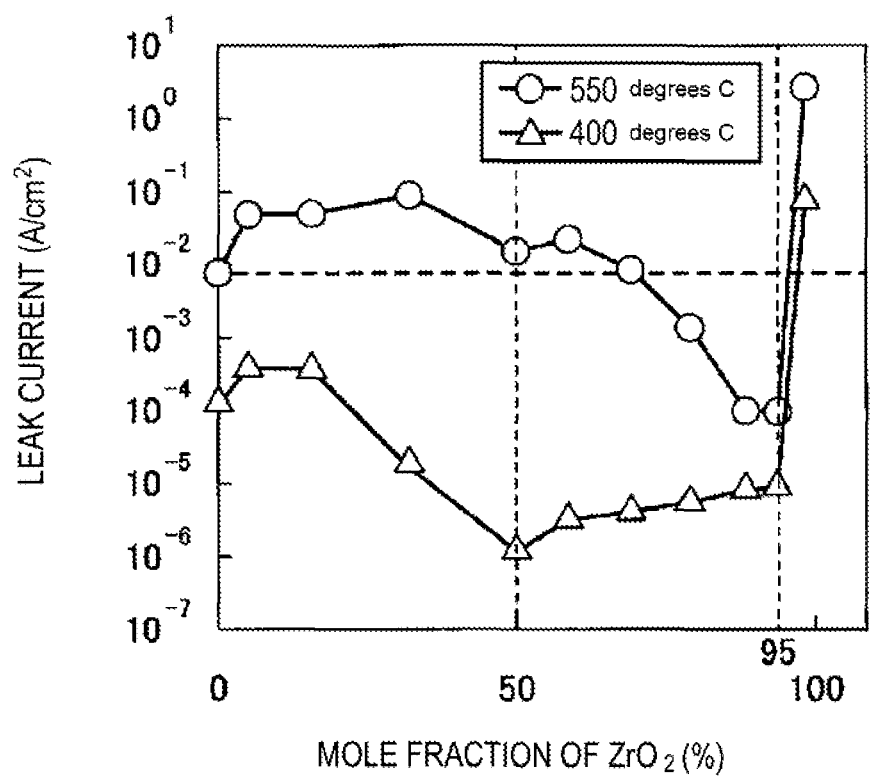
FIG. 4 is a view for explaining the effects of a semiconductor device according to an embodiment of the present invention and is a schematic diagram for explaining the relationship between a mole fraction of a $ZrO_2$ of a mixed insulating film and a leak current.

FIG. 4 is another view for explaining the effects of a semiconductor device according to an embodiment of the present disclosure and is a schematic diagram for explaining the relationship between a mole fraction of a $ZrO_2$ of a mixed insulating film and a leak current. In FIG. 4, the horizontal axis indicates a mole fraction of a $ZrO_2$ of an $HfZrO_x$ film and the vertical axis indicates a leak current value.

As shown in FIG. 3 and so forth, use of an elementary substance, $ZrO_2$ (namely, a $ZrO_2$ which does not contain an $HfO_2$) makes it possible to achieve a relative permittivity k of 27 through a heat treatment performed at the lowest temperature. However, as illustrated in FIG. 4, if the elementary substance of $ZrO_2$ is used, an increase in the leak current caused by the heat treatment becomes larger.

In the insulating film of the present embodiment (the $HfO_2$ content is 5 mol % to 50 mol %), it is possible to enhance a relative permittivity through a heat treatment performed at a low temperature and to keep a leak current low. Particularly, in an insulating film containing $HfO_2$ at a ratio of 5 mol % to 30 mol %, an increase in leak current is suppressed even if a heat treatment is performed at a high temperature of 550 degrees C. In an insulating film which contains $HfO_2$ at a ratio of 5 mol % to 10 mol %, the increase in leak current is further suppressed. Therefore, the $HfO_2$ content in the insulating film is preferably in some embodiments 5 mol % to 50 mol %, or 5 mol % to 30 mol %, or 5 mol % to 10 mol %.

Description will now be made on how to reduce the lower limit value of the heat treatment temperature (crystallization temperature) to increase the relative permittivity of the insulating film according to an embodiment of the present disclosure. $HfO_2$ and $ZrO_2$ in some cases have identical crystal structures with each other. The ionic radii of metal ions of $HfO_2$ and $ZrO_2$ are 80 pm (Hf [4+]) and 81 pm (Zr [4+]), respectively, which are substantially equal to each other. If $HfO_2$ and $ZrO_2$ having identical crystal structures with each other and being substantially equal in ion radius to each other are mixed with each other, the crystallization temperature of the mixed oxide resides between the crystallization temperature of an $HfO_2$ and the crystallization temperature of a $ZrO_2$. Presumably, this is because, in a crystallization process, $ZrO_2$ is first crystallized, and then $HfO_2$ is crystallized using the crystallized $ZrO_2$ as a template. In other words, the crystallized $ZrO_2$ coexists, and therefore $ZrO_2$ acts as a crystal nucleus. Thus, it is presumed that an activation energy for crystallizing $HfO_2$ is reduced and $HfO_2$ is crystallized at a lower temperature.

One or more kinds of oxides of yttrium (Y), cerium (Ce), lanthanum (La), aluminum (Al) and silicon (Si) may be added to the insulating film according to an embodiment of the present disclosure. The additional amount of the oxides may be about 10 mol %.

The ion radii of metal ions of the oxides of Y, Ce and La are 93 pm (Y [3+]), 101 pm (Ce [4+]) and 115 pm (La [3+]), respectively, and are larger than the ion radius of a metal ion of Hf or Zr. Thus, if these elements are added, it is hard for the elements to be rearranged as the crystallization temperature increases. On the other hand, the crystallization temperature of oxides of Si, Al or the like increases, since covalency of Si, Al or the like is high. In other words, if the oxides of the aforementioned elements are added, it is possible to increase the heat treatment temperature of the insulating film. Therefore, in a case where the present disclosure is applied to a process in which a heat treatment needs to be performed at a higher temperature, for example, a gate first process, it is desirable to add the aforementioned oxides.

As described above, the $HfZrO_x$ insulating film according to an embodiment of the present disclosure broadens the temperature margin of the heat treatment temperature to achieve a relative permittivity k of 27 or more and can suppress an increase in leak current caused by the heat treatment.

Second Embodiment

In the first embodiment, description has been made on the hafnium zirconium oxide (HfZrOx) film which is a mixed film of $ZrO_2$ and $HfO_2$. In the second embodiment, description will be made on a laminated film obtained by laminating $ZrO_2$ and $HfO_2$.

Figure 5:
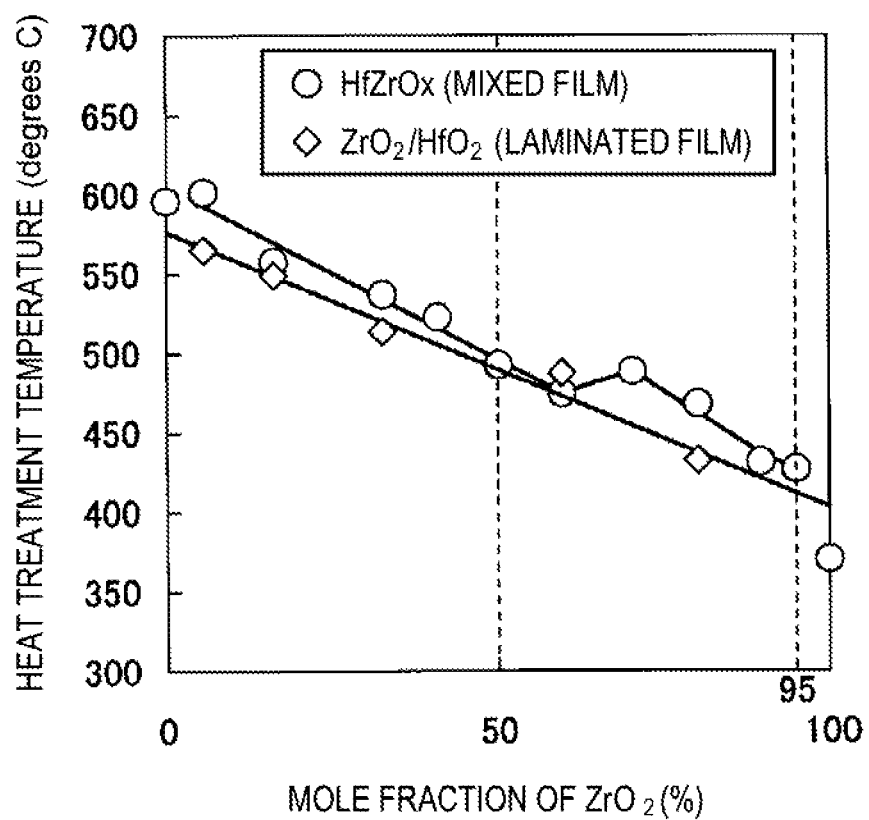
FIG. 5 is a view for explaining the effects of a semiconductor device according to an embodiment of the present disclosure and is a schematic diagram for explaining the relationship between a mole fraction of a $ZrO_2$ of a laminated insulating film and a heat treatment temperature.

FIG. 5 is another view for explaining the effects of a semiconductor device according to an embodiment of the present disclosure and is a schematic diagram for explaining the relationship between a mole fraction of $ZrO_2$ of a laminated insulating film and a heat treatment temperature. In FIG. 5, the horizontal axis indicates the mole fraction of $ZrO_2$ of the insulating film and the vertical axis indicates a lower limit value of a heat treatment temperature which is required to achieve a relative permittivity k of 27.

It can be noted in FIG. 5 that, in the case of the laminated insulating film obtained by laminating $ZrO_2$ and $HfO_2$, just like the first embodiment, the heat treatment temperature required to achieve the relative permittivity k of 27 gets reduced. The reduction in the heat treatment temperature tends to become larger in the case of the laminated structure than in the case of the mixed film. The detailed reason for this is unclear. It is presumed that, in the case of the laminated structure, in the eduction process of $ZrO_2$ serving as the crystal nucleus, the energy incongruent to recombination of bonds and adjustment of the aggregation state becomes smaller than in the case of the mixed film.

Figure 6:
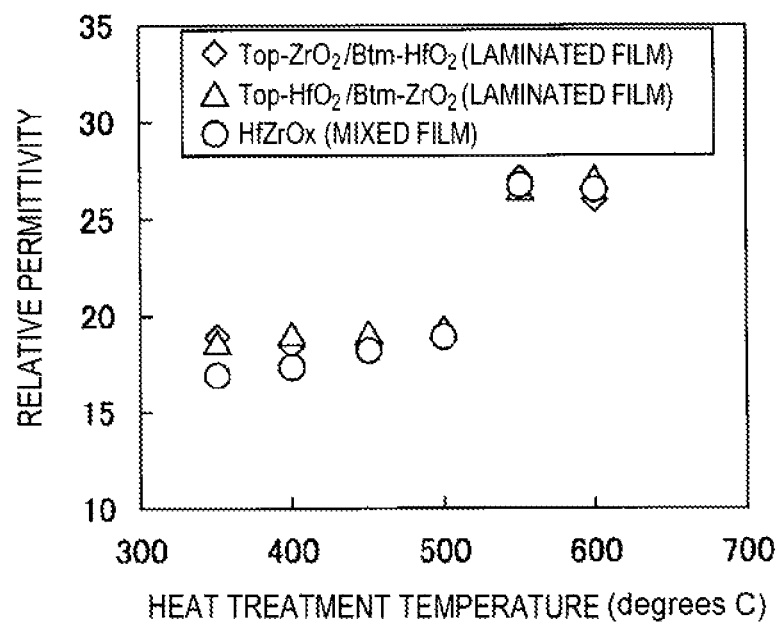
FIG. 6 is a view for explaining the effects of a semiconductor device according to an embodiment of the present disclosure and is a schematic diagram for explaining the relationship between a heat treatment temperature and a relative permittivity.

FIG. 6 is another exemplary view for explaining the effects of a semiconductor device according to an embodiment of the present disclosure and is a schematic diagram for explaining the relationship between a heat treatment temperature and a relative permittivity. In FIG. 6, the horizontal axis indicates a heat treatment temperature and the vertical axis indicates a relative permittivity.

As can be seen in FIG. 6, in the case of the laminated structure, the effect of reducing a heat treatment temperature remains unchanged between when $ZrO_2$ is first laminated on the workpiece and then an $HfO_2$ is laminated thereon and when $HfO_2$ is first laminated on the workpiece and then a $ZrO_2$ is laminated thereon. As mentioned above, this is because, in the crystallization process, $ZrO_2$ is first crystallized and then $HfO_2$ is crystallized using the crystallized $ZrO_2$ as a template.

As described above, as compared with the mixed film of the first embodiment, the laminated film of $HfO_2$ and $ZrO_2$ according to an embodiment of the present disclosure can further broaden the temperature margin of the heat treatment temperature for achieving a relative permittivity k of 27 or more.

Third Embodiment

When the insulating film according to an embodiment of the present disclosure is thermally treated at a temperature equal to or higher than the crystallization temperature (about 600 degrees C.) of $HfO_2$, in particular, a layer of $HfO_2$ is thermodynamically educed more easily in a monoclinic phase having a relatively low relative permittivity than in a cubic phase having a relatively high relative permittivity. For that reason, crystallization proceeds while the cubic phase of $ZrO_2$ and the monoclinic phase of $HfO_2$ compete with each other. It is sometimes the case that the relative permittivity of the insulating film thus obtained is reduced.

Therefore, in order to increase the relative permittivity of the obtained insulating film in a case where a heat treatment needs to be performed at a temperature equal to or higher than the crystallization temperature of $HfO_2$ (including a case where a crystallization heat treatment is performed at a low temperature), it is preferred in some embodiments that, by increasing the crystallization temperature of an $HfO_2$, $ZrO_2$ of the cubic phase is first educed and then the crystallization of the insulating film as a whole is carried out using the educed $ZrO_2$ as a template.

As a method of increasing the crystallization temperature of $HfO_2$, it is possible to increase the crystallization temperature of $HfO_2$ by adding nitrogen through a plasma process (by performing a plasma nitriding treatment). The reason for the crystallization temperature of $HfO_2$ being increased by the plasma nitriding treatment is presumed that the microcrystal structure of $HfO_2$ is destroyed or (a portion of) the oxygen of $HfO_2$ is substituted by nitrogen by the plasma nitriding treatment.

Figure 7:
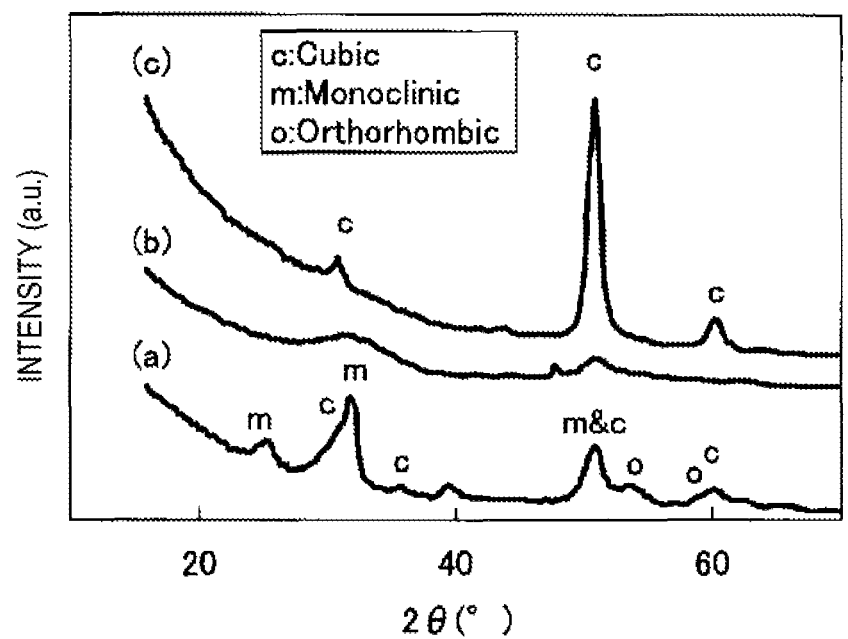
FIG. 7 is a view for explaining the effects of a semiconductor device according to an embodiment of the present disclosure, which shows an example of an X-ray diffraction result.

FIG. 7 is another view for explaining the effects of a semiconductor device according to an embodiment of the present disclosure, which shows an example of a result of X-ray diffraction (XRD). In FIG. 7, curve (a) shows an example of an XRD result for an insulating film obtained by thermally treating, at 700 degrees C., an $HfO_2$ film (having a film thickness of 2.5 nm) which is not subjected to a plasma nitriding treatment. Curve (b) shows an example of an XRD result for an insulating film obtained by thermally treating, at 700 degrees C., an $HfO_2$ film (having a film thickness of 2.5 nm) which has been subjected to the plasma nitriding treatment. Curve (c) shows an example of an XRD result for an insulating film obtained by subjecting an $HfO_2$ film (having a film thickness of 2.0 nm) to the plasma nitriding treatment, forming a $ZrO_2$ film (having a film thickness of 0.5 nm) thereon, and thermally treating the films at 700 degrees C.

It can be seen in curve (a) of FIG. 7 that the monoclinic phase having a relatively low relative permittivity is dominant in the $HfO_2$ film which is not subjected to a plasma treatment. Further, it is recognized in curve (b) of FIG. 7 that the crystallization temperature is increased if only a plasma treatment is performed. Moreover, it is confirmed in curve (c) of FIG. 7 that a monolayer structure having a cubic phase is generated by subjecting an $HfO_2$ film to a plasma nitriding treatment, forming a $ZrO_2$ film thereon and thermally treating the films at 700 degrees C.

Figure 8:
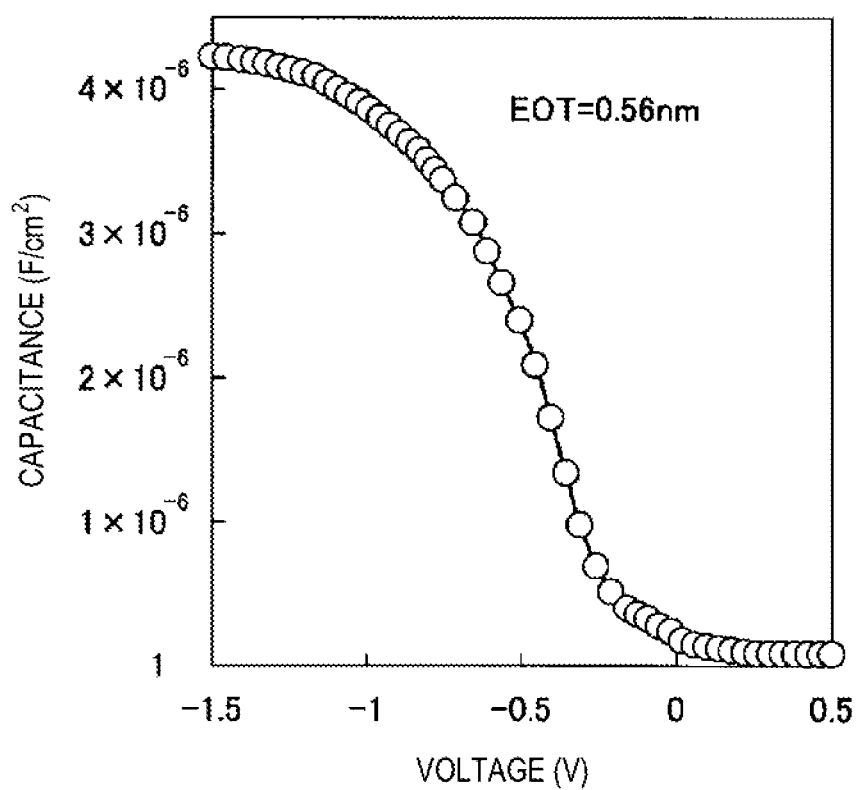
FIG. 8 shows one example of a CV characteristic of an insulating film obtained by subjecting an $HfO_2$ film to a plasma nitriding treatment, forming a $ZrO_2$ film thereon and thermally treating the films at 700 degrees C.

FIG. 8 shows one example of a CV characteristic of an insulating film obtained by subjecting an $HfO_2$ film to a plasma nitriding treatment, forming a $ZrO_2$ film thereon, and thermally treating the films at 700 degrees C. In the present embodiment, the EOT is 0.56 nm, which means that it becomes possible to form an insulating film having a very small EOT.

As described above, by performing the plasma nitriding treatment, it is possible to destroy the monoclinic phase of the $HfO_2$ film and to increase the crystallization temperature of the $HfO_2$ film. Thus, the temperature margin of the heat treatment temperature at which a film having a high relative permittivity is obtainable can be broadened toward a high temperature side.

As another example of the method of increasing the crystallization temperature of $HfO_2$, there is a method of adding one or more kinds of oxides of yttrium (Y), cerium (Ce), lanthanum (La), aluminum (Al) and silicon (Si) as described above.

Fourth Embodiment

Next, description will be made on an embodiment in which it was confirmed that the insulating film has a higher relative permittivity and a superior leak current characteristic.

Figure 9:
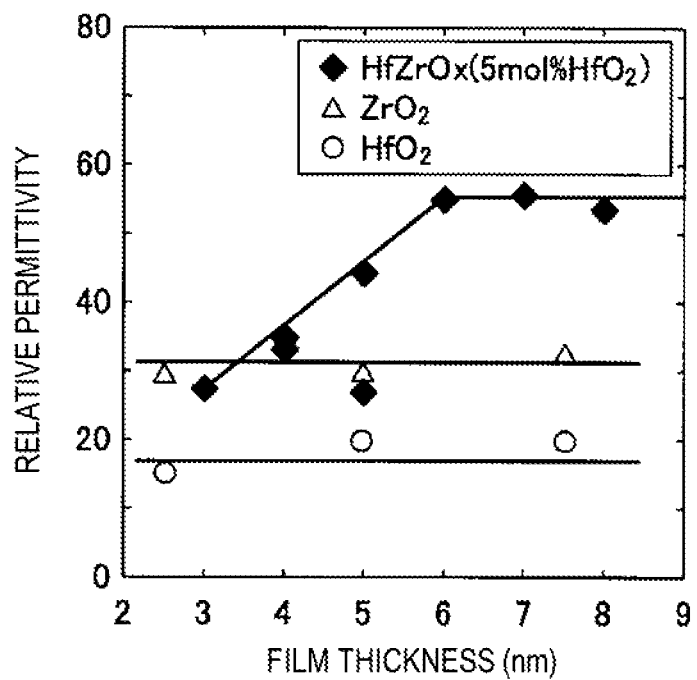
FIG. 9 is a view for explaining the effects of a semiconductor device according to an embodiment of the present disclosure and is a schematic diagram for explaining the relationship between a film thickness and a relative permittivity.

FIG. 9 is another view for explaining the effects of a semiconductor device according to an embodiment of the present disclosure and is a schematic diagram for explaining the relationship between a film thickness and a relative permittivity.

Figure 11:
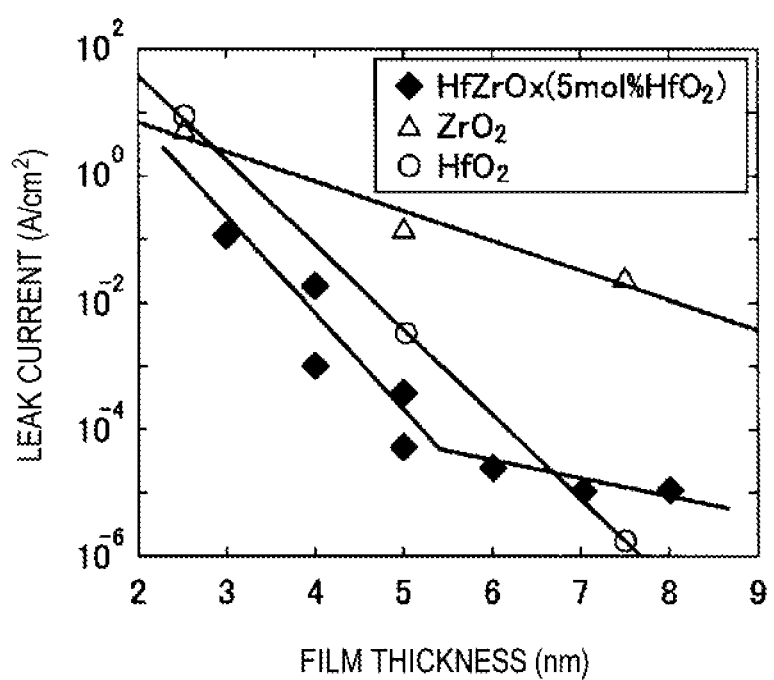
FIG. 11 is a view for explaining the effects of a semiconductor device according to an embodiment of the present disclosure and is a schematic diagram for explaining the relationship between a film thickness and a leak current.

In FIG. 9, the horizontal axis indicates a film thickness of each of the films and the vertical axis indicates a relative permittivity of each of the films. Further, in FIG. 9, diamonds indicate a plot of a mixed insulating film in which the content of $HfO_2$ is 5 mol %. Triangles indicate a plot of a $ZrO_2$ film. Circles indicate a plot of an $HfO_2$ film. In FIG. 9 and FIG. 11 to be described below, as the crystallization conditions, the crystallization temperature is set equal to 500 degrees C. and the crystallization heat treatment time is set equal to 1 minute.

As shown in FIG. 9, in the mixed insulating film of the present embodiment in which the content of $HfO_2$ is 5 mol %, the relative permittivity grows larger as the film thickness becomes greater. If the film thickness is 6 nm or greater, the relative permittivity is saturated at about 60. On the other hand, the relative permittivity of the $ZrO_2$ film is kept constant at about 27 to 30, and the relative permittivity of the $HfO_2$ film is kept constant at 20 or less. It was found that, in the insulating film of the present embodiment, a relative permittivity value far greater than a relative permittivity value of a conventional gate insulating film or a conventional capacitor insulating film can be obtained by increasing the film thickness.

Description will be made on the reason why an increase in the film thickness leads to an increase in the relative permittivity of the insulating film of the present embodiment with reference to FIGS. 10A and 10B.

Figure 10A:
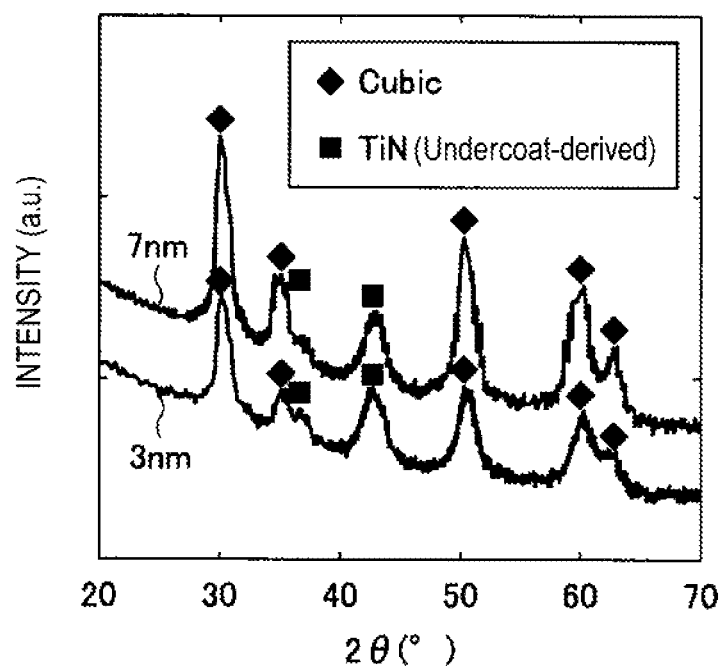
FIG. 10A is a view for explaining the effects of a semiconductor device according to an embodiment of the present disclosure, which shows another example of an X-ray diffraction result.

FIG. 10A is another view for explaining the effects of a semiconductor device according to an embodiment of the present disclosure, which shows another example of an X-ray diffraction result. FIG. 10B is a view which partially enlarges FIG. 10A. In FIGS. 10A and 10B, there are shown X-ray diffraction results of mixed insulating films having a content of $HfO_2$ of 5 mol % and having a film thickness of 3 nm or 7 nm.

As shown in FIG. 10A, it was confirmed that, in the insulating film of the present embodiment, cubic-phase-derived peaks having a relatively high relative permittivity appear both in a case where the film thickness is 3 nm and in a case where the film thickness is 7 nm. Further, as shown in FIG. 10B, it was confirmed that tetragonal-phase-derived peaks appear. This means that the insulating film of the present embodiment is in a mixed crystal state in which the cubic phase and the tetragonal phase are mixed. The tetragonal phase is usually crystallized by a crystallization heat treatment performed at a high temperature of 1200 degrees C. or more. The tetragonal phase is higher in a relative permittivity than the cubic phase or the monoclinic phase.

The above results reveal that, according to the semiconductor device manufacturing method of the present embodiment, a tetragonal phase having a high relative permittivity can be crystallized by the crystallization heat treatment performed at a low temperature of 500 degrees C.

Figure 10B:
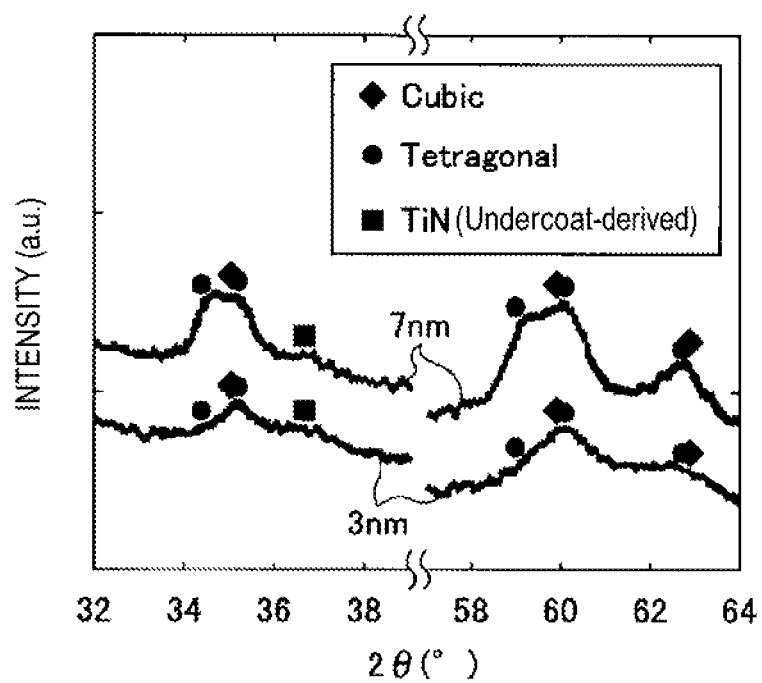
FIG. 10B is a view which partially enlarges FIG. 10A.

As can be seen in FIG. 10B where the insulating film having the film thickness of 3 nm and the insulating film having the film thickness of 7 nm are compared, tetragonal-phase-derived peaks are more clearly identified in the insulating film having the film thickness of 7 nm. In light of the above results and the results shown in FIG. 9, it is presumed that, in the insulating film of the present embodiment, if the film thickness increases within a range of from 3 nm to 6 nm, a crystallization ratio of the tetragonal phase having a large relative permittivity becomes greater. In other words, it is presumed that an increase in the film thickness leads to an increase in the crystallization ratio of the tetragonal phase, which results in an increase in the relative permittivity of the obtained insulating film.

FIG. 11 is another view for explaining the effects of a semiconductor device according to an embodiment of the present disclosure and is a schematic diagram for explaining the relationship between film thickness and leak current.

In FIG. 11, the horizontal axis indicates a film thickness of each of the films and the vertical axis indicates a leak current of each of the films. Further, in FIG. 11, diamonds indicate a plot of a mixed insulating film in which the content of an $HfO_2$ is 5 mol %. Triangles indicate a plot of a $ZrO_2$ film. Circles indicate a plot of an $HfO_2$ film.

In a typical insulating film, the leak current becomes smaller as the film thickness grows larger. As shown in FIG. 11, the insulating film of the present embodiment has the same tendency.

In the insulating film of the present embodiment, as compared with the $ZrO_2$ film, the leak current is controlled to have a low value. Further, the insulating film of the present embodiment is lower in leak current value than the $HfO_2$ film within a film thickness range of 6 nm or less. Even in a film thickness range of 7 nm or more, the insulating film of the present embodiment has a leak current value substantially equal to the leak current value of the $HfO_2$ film.

The aforementioned results indicate that the insulating film of the present embodiment is high in relative permittivity and superior in the leak current characteristic.

<Semiconductor Device Manufacturing Method>

Description will now be made on a semiconductor device manufacturing method according to an embodiment of the present disclosure. In the subject specification, description will be provided about a case where a gate insulating film is formed using a silicon wafer as the workpiece. However, the present disclosure is not limited thereto.

First, the surface of a silicon wafer is cleaned with a dilute hydrofluoric acid or the like. If necessary, a pretreatment is performed to form an interfacial layer composed of $SiO_2$. The interfacial layer composed of $SiO_2$ can be formed by cleaning the silicon wafer with hydrochloric acid/hydrogen peroxide ($HCl/H_2O_2$). In general, the interfacial layer composed of $SiO_2$ is formed to have a thickness of about 0.3 nm.

Then, an insulating film according to the present embodiment is formed. As described above, the insulating film according to the present embodiment contains $ZrO_2$ and $HfO_2$. The content of $HfO_2$ in the insulating film is 5 mol % to 50 mol %. The film containing $ZrO_2$ and $HfO_2$ may be a $HfZrO_x$ film which is a mixed film of $ZrO_2$ and $HfO_2$ or may be a laminated film obtained by laminating $ZrO_2$ and $HfO_2$ at the aforementioned ratio.

The $HfZrO_x$ film can be formed by such a method as ALD (Atomic Layer Deposition), CVD (Chemical Vapor Deposition) and PVD (Physical Vapor Deposition). In this case, $ZrO_2$ and $HfO_2$ are deposited at a specified ratio (with the content of the $HfO_2$ being 5 mol % to 50 mol %) to have a subtotal thickness equal to 0.5 nm (as one example). The deposition is repeated a predetermined number of times such that the deposited $ZrO_2$ and $HfO_2$ have a total thickness equal to, e.g., 2.5 nm. As described above, $HfO_2$ may be deposited after $ZrO_2$ is deposited. Alternatively, $ZrO_2$ may be deposited after $HfO_2$ is deposited. In the present embodiment, the thickness of the insulating film is set at 2.5 nm by way of example. However, the present disclosure is not limited thereto. For example, if the insulating film is used as a gate insulating film, the thickness of the insulating film is typically set at 5 nm or less. An person of ordinary skill in the art can suitably select a film thickness depending on the use of the insulating film or the like.

A laminated film of $ZrO_2$ and $HfO_2$ can also be formed by a method such as ALD, CVD and PVD. In this case, $ZrO_2$ and $HfO_2$ are deposited at a specified ratio (with the content of the $HfO_2$ being 5 mol % to 50 mol %) to have a total thickness equal to, e.g., 2.5 nm. As mentioned above, the order of depositing $ZrO_2$ and $HfO_2$ is not particularly limited even in the case of forming the laminated film. In the case of performing the aforementioned plasma nitriding treatment, an $HfO_2$ film is first formed. Then, the plasma nitriding treatment is performed, and a $ZrO_2$ film is formed.

A raw material (precursor) used in forming the insulating film by ALD is not particularly limited. Examples of the precursor used in forming the $HfO_2$ film may include an amide-based organic hafnium compound such as TDEAH (tetrakisdiethylaminohafnium), TEMAH (tetrakisethylmethylaminohafnium) or the like and an alkoxide-based organic hafnium compound such as HTB (hafnium tetra-tert-butoxide) or the like. Examples of the precursor used in forming the $ZrO_2$ film may include an amide-based organic hafnium compound such as TEMAZ (tetrakisethylmethylaminozirconium) or the like. As an oxidizing agent, an $O_3$ gas, an $O_2$ gas, an $H_2O$ gas, an $NO_2$ gas, an NO gas, an $N_2O$ gas or the like may be used. At this time, the reactivity may be increased by converting the oxidizing agent into plasma.

In the case where the $HfO_2$ film or the $ZrO_2$ film is formed by ALD or the like, the $HfO_2$ film is formed by alternately repeating a sequence of causing an Hf precursor or a Zr precursor to be adsorbed thinly and a sequence of supplying an oxidizing agent. In the case where the $HfO_2$ film or the $ZrO_2$ film is formed by CVD, the Hf precursor or the Zr precursor and the oxidizing agent are simultaneously supplied while heating a silicon wafer. When the $HfO_2$ film is formed by ALD, the film-forming temperature is usually set at about 150 degrees C. to 350 degrees C. When the $HfO_2$ film is formed by CVD, a film-forming temperature is usually set at about 350 degrees C. to 600 degrees C.

After the insulating film is formed, the crystallization heat treatment is performed in order to crystallize the insulating film thus formed. The crystallization heat treatment may be performed by, for example, spike annealing, in an RTP (Rapid Thermal Process) device which makes use of lamp heating.

After the insulating film of the present embodiment is formed, a gate electrode material such as TiN is formed by, for example, PVD, thereby manufacturing a semiconductor device. The semiconductor device thus obtained is usually sintered at a low temperature of about 400 degrees C. to electrically deactivate unpaired electrons existing between the insulating film and the silicon.

<Substrate Treatment System for Implementing the Embodiments of the Present Disclosure>

Next, a substrate treatment system for implementing the semiconductor device manufacturing method of the present embodiment will be described with reference to FIG. 12.

Figure 12:
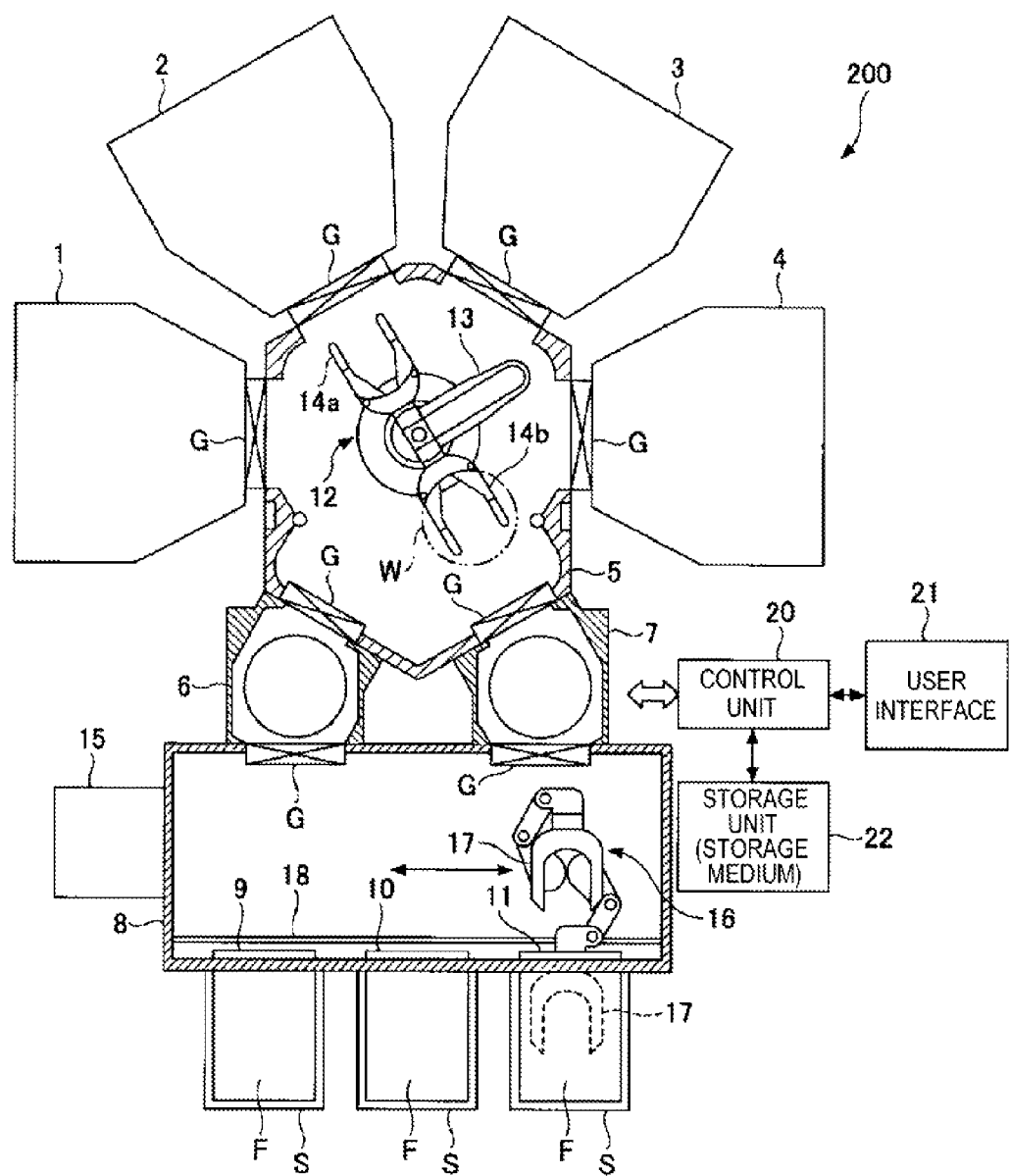
FIG. 12 is a schematic diagram illustrating a configuration example of a substrate treatment system for implementing a semiconductor device manufacturing method according to an embodiment of the present disclosure.

FIG. 12 is a schematic diagram illustrating a configuration example of the substrate treatment system for implementing the semiconductor device manufacturing method of the present embodiment. A substrate treatment system 200 is configured to form a gate insulating film on a silicon wafer.

As shown in FIG. 12, the substrate treatment system 200 includes two film-forming apparatuses 1 and 2 for forming the insulating film of the present embodiment and a crystallization treatment apparatus 4 for subjecting the obtained insulating film to a crystallization heat treatment. The substrate treatment system 200 may further include a plasma treatment apparatus 3 for performing a plasma nitriding treatment.

The film-forming apparatuses 1 and 2, the crystallization treatment apparatus 4 and the plasma treatment apparatus 3 are installed in a corresponding relationship with four sides of a wafer transfer chamber 5 having a hexagonal shape. Load lock chambers 6 and 7 are respectively installed on the remaining two sides of the wafer transfer chamber 5. A wafer loading/unloading chamber 8 is installed at the opposite sides of the load lock chambers 6 and 7 from the wafer transfer chamber 5. Ports 9, 10 and 11 which support three FOUPs F capable of accommodating silicon wafers W therein are attached to the opposite side of the wafer loading/unloading chamber 8 from the load lock chambers 6 and 7.

The film-forming apparatuses 1 and 2, the crystallization treatment apparatus 4, the plasma treatment apparatus 3 and the load lock chambers 6 and 7 are connected to the respective sides of the wafer transfer chamber 5 having a hexagonal shape through gate valves G. By opening the respective gate valves G, the film-forming apparatuses 1 and 2, the crystallization treatment apparatus 4, the plasma treatment apparatus 3 and the load lock chambers 6 and 7 are brought into communication with the wafer transfer chamber 5. By closing the respective gate valves G, the film-forming apparatuses 1 and 2, the crystallization treatment apparatus 4, the plasma treatment apparatus 3 and the load lock chambers 6 and 7 are cut off from the wafer transfer chamber 5. Further, gate valves G are installed at the portions of load lock chambers 6 and 7 connected to the wafer loading/unloading chamber 8. By opening the gate valves G, the load lock chambers 6 and 7 are brought into communication with the wafer loading/unloading chamber 8. By closing the gate valves G, the load lock chambers 6 and 7 are cut off from the wafer loading/unloading chamber 8.

A wafer transfer device 12 for carrying the wafers W into and out of the film-forming apparatuses 1 and 2, the crystallization treatment apparatus 4, the plasma treatment apparatus 3 and the load lock chambers 6 and 7 is installed within the wafer transfer chamber 5. The wafer transfer device 12 is disposed substantially at the center of the wafer transfer chamber 5. The wafer transfer device 12 includes a rotation/expansion/contraction unit 13 capable of making rotation, expansion and contraction. Two blades 14a and 14b for holding the wafers W are provided at the distal end of the rotation/expansion/contraction unit 13. The blades 14a and 14b are attached to the rotation/expansion/contraction unit 13 so as to face opposite directions. The inside of the wafer transfer chamber 5 is kept at a predetermined vacuum degree.

A HEPA filter (not shown) is installed in the top portion of the wafer loading/unloading chamber 8. Through the HEPA filter, clean air free from organic substances or particles is supplied as a downflow into the wafer loading/unloading chamber 8. Thus, loading and unloading of the wafers W is performed in a clean air atmosphere at atmospheric pressure. Shutters (not shown) are respectively installed in three ports 9, 10 and 11 where FOUPs F are attached. FOUPs which accommodate the wafers W therein or FOUPs which remain empty are directly attached to the ports 9, 10 and 11. When the FOUPs are attached to the ports 9, 10 and 11, the shutters are removed such that the FOUPs communicate with the wafer loading/unloading chamber 8 while preventing outside air from coming in. Further, an alignment chamber 15 is installed on one side surface of the wafer loading/unloading chamber 8 to perform alignment of the wafers W.

A wafer transfer device 16 for carrying the wafers W into and out of the FOUPs F and for carrying the wafers W into and out of the load lock chambers 6 and 7 is installed within the wafer loading/unloading chamber 8. The wafer transfer device 16 includes two articulated arms and is configured to run on a rail 18 along an arrangement direction of the FOUPs F. The transfer of the wafers W is performed by mounting the wafers W on hands 17 installed at the distal ends of the articulated arms. In FIG. 12, one of the hands 17 exists within the wafer loading/unloading chamber 8 and the other is inserted into one of the FOUPs F.

Components of the substrate treatment system 200 (e.g., the film-forming apparatuses 1 and 2, the crystallization treatment apparatus 4, the plasma treatment apparatus 3, and the wafer transfer devices 12 and 16) are connected to and controlled by a control unit 20 including a computer. A user interface 21 is connected to the control unit 20. The user interface 21 includes a keyboard through which an operator performs a command input operation or other operations in order to manage the system and a display which visually displays the operating situation of the system.

Further, a storage unit 22 is connected to the control unit 20. The storage unit 22 stores a control program for realizing, under the control of the control unit 20, different kinds of treatments implemented in the system and a program (namely, a treatment recipe) for causing the respective components to implement treatments according to treatment conditions. The treatment recipe is stored in a storage medium of the storage unit 22. The storage medium may be a hard disk or may be a portable one such as a CDROM, a DVD, a flash memory or the like. Further, the treatment recipe may be suitably transmitted from other devices through, for example, a dedicated line.

In the substrate treatment system 200, a treatment is implemented by, for example, calling a treatment recipe from the storage unit 22 pursuant to an instruction from the user interface 21 and causing the control unit 20 to execute the treatment recipe. The control unit 20 may directly control the respective components. Alternatively, individual controllers may be provided in the respective components so that the control unit 20 can control the respective components through the controllers.

In the substrate treatment system 200 according to an embodiment of the present disclosure, the FOUP F which accommodates the wafers W subjected to a pretreatment is first loaded. Subsequently, one wafer W is taken out of the FOUP F by the wafer transfer device 16 which is disposed within the wafer loading/unloading chamber 8 kept in a clean air atmosphere at atmospheric pressure. The wafer W taken out of the FOUPs F is carried into the alignment chamber 15 where the position of the wafer W is aligned. Then, the wafer W is carried into one of the load lock chambers 6 and 7. The inside of the relevant load lock chamber is vacuumized. The wafer transfer device 12 in the wafer transfer chamber 5 takes the wafer W out of the relevant load lock chamber and inserts it into the film-forming apparatuses 1 and 2 where the insulating film of the present embodiment is formed. While two film-forming apparatuses are used in the present embodiment, $HfO_2$ and $ZrO_2$ may be added, mixed, and laminated in a single film-forming apparatus.

When performing a plasma nitriding treatment, for example, an $HfO_2$ film is formed in the film-forming apparatus 1. Thereafter, the wafer W is taken out of the film-forming apparatus 1 by the wafer transfer device 12 and is carried into the plasma treatment apparatus 3 where the plasma nitriding treatment is performed. Then, the wafer W is taken out of the plasma treatment apparatus 3 by the wafer transfer device 12 and is inserted into the film-forming apparatus 2 where a $ZrO_2$ film is formed.

Thereafter, the wafer W is taken out of the film-forming apparatus 2 by the wafer transfer device 12 and is inserted into the crystallization treatment apparatus 4 where a crystallization treatment is performed. After the crystallization treatment, the wafer W is carried into one of the load lock chambers 6 and 7 by the wafer transfer device 12. The inside of the relevant load lock chamber is returned to atmospheric pressure. The wafer W existing within the relevant load lock chamber is taken out by the wafer transfer device 16 disposed within the wafer loading/unloading chamber 8 and is accommodated within one of the FOUPs F. The operations described above are performed with respect to one lot of wafers W, whereby one set of treatments is finished.

<Configuration Example of Film-Forming Apparatuses 1 and 2>

Figure 13:
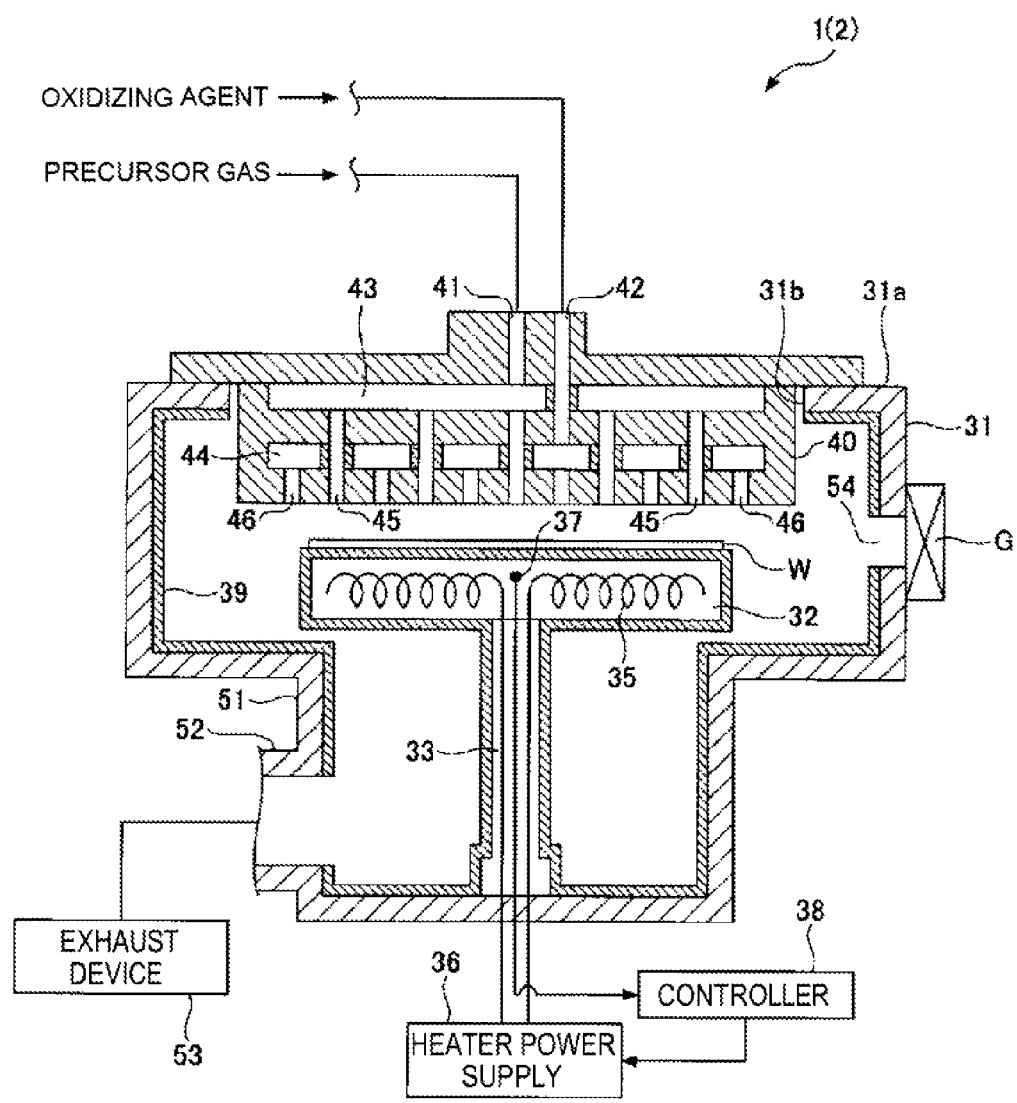
FIG. 13 is a schematic diagram illustrating a configuration example of a film-forming apparatus according to an embodiment of the present disclosure.

Next, the configuration of the film-forming apparatuses 1 and 2 will be described with reference to FIG. 13. FIG. 13 is a schematic diagram illustrating a configuration example of the film-forming apparatus 1 (or 2) according to an embodiment of the present disclosure. Description will now be made on an example of a film-forming apparatus in which the film-forming is performed by ALD or CVD as a method of forming the insulating film of the present embodiment with the film-forming apparatus 1 (and 2). Alternatively, it may be possible to employ a configuration (not shown) in which the film-forming is formed by PVD.

The film-forming apparatus 1 includes a hermetically-sealed chamber 31 having a substantially cylindrical shape. A susceptor 32 for horizontally supporting a wafer W as a workpiece is disposed within the chamber 31. A support member 33 having a cylindrical shape is provided below the center of the susceptor 32. The susceptor 32 is supported by the support member 33. The susceptor 32 is made of, e.g., ceramics of AlN.

A heater 35 is embedded in the susceptor 32. A heater power supply 36 is connected to the heater 35. Further, a thermocouple 37 is provided near a top surface of the susceptor 32. A signal of the thermocouple 37 is transmitted to a controller 38. In response to the signal of the thermocouple 37, the controller 38 transmits a command to the heater power supply 36, thereby controlling the heating operation of the heater 35 and controlling the temperature of the wafer W to become a predetermined temperature.

A quartz liner 39 for preventing deposition of adherent matter is provided on an inner wall of the chamber 31 and outer circumferential surfaces of the susceptor 32 and the support member 39. A purge gas (shield gas) is allowed to flow through between the quartz liner 39 and a wall portion of the chamber 31, whereby the deposition of adherent matter on the wall portion and the contamination thereof are prevented. The quartz liner 39 is removable so as to efficiently maintain and repair the inside of the chamber 31.

A circular hole 31b is formed in a top wall 31a of the chamber 31. A shower head 40 protruding into the chamber 31 is inserted into the circular hole 31b. The shower head 40 is configured to discharge the aforementioned film-forming precursor gas into the chamber 31. A first introduction line 41 for introducing the precursor gas and a second introduction line 42 for introducing the oxidizing agent are connected to the upper portion of the shower head 40.

Within the shower head 40, spaces 43 and 44 are provided in two stages (upper and lower stages). The first introduction line 41 is connected to the upper space 43. First gas discharge paths 45 extend from the space 43 to a lower surface of the shower head 40. The second introduction line 42 is connected to the lower space 44. Second gas discharge paths 46 extend from the space 44 to the lower surface of the shower head 40. In other words, the shower head 40 is of a post-mix type in which the precursor gas and the oxidizing agent are uniformly diffused in the spaces 43 and 44 without being mixed with each other and are independently discharged from the first and second gas discharge paths 45 and 46.

The susceptor 32 is configured to be moved up and down by an elevator mechanism not shown. A process gap is adjusted so as to minimize space exposed to the precursor gas.

A downwardly-protruding exhaust chamber 51 is provided in a bottom wall of the chamber 31. An exhaust pipe 52 is connected to a side surface of the exhaust chamber 51. An exhaust device 53 is connected to the exhaust pipe 52. The inside of the chamber 31 can be depressurized to a predetermined vacuum degree by operating the exhaust device 53.

A carry-in/carry-out port 54 for carrying the wafer W into and out of the wafer transfer chamber 5 and a gate valve G for opening and closing the carry-in/carry-out port 54 are provided in a sidewall of the chamber 31.

In the film-forming apparatus configured as above, the wafer W is first carried into the chamber 31. Then, the inside of the chamber 31 is evacuated to be in a predetermined vacuum state. The wafer W is heated to a predetermined temperature by the heater 35. In this state, the precursor gas introduced through the first introduction line 41 and the oxidizing agent introduced through the second introduction line 42 are introduced into the chamber 31 through the shower head 40.

Thus, the precursor gas and the oxidizing agent react with each other on the heated wafer W, whereby the insulating film of the present embodiment is formed on the wafer W.

<Configuration Example of Plasma Treatment Apparatus 3>

Figure 14:
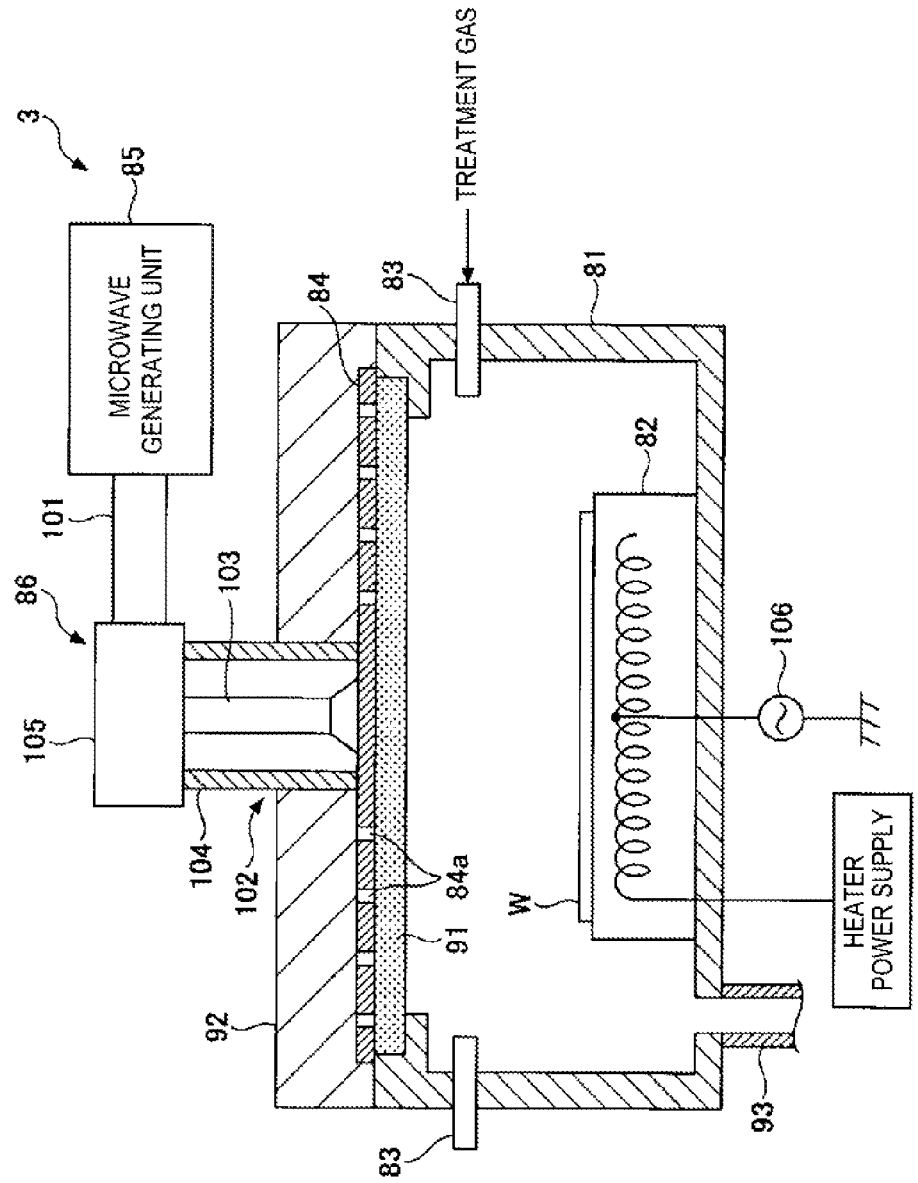
FIG. 14 is a schematic diagram illustrating a configuration example of a plasma treatment apparatus according to an embodiment of the present disclosure.

Next, the plasma treatment apparatus 3 for implementing the plasma nitriding treatment will be described with reference to FIG. 14. FIG. 14 is a schematic diagram illustrating a configuration example of the plasma treatment apparatus 3 according to an embodiment of the present disclosure.

Described herein by way of example is a microwave plasma treatment apparatus, namely an RLSA (Radial Line Slot Antenna) microwave plasma type microwave plasma treatment apparatus. However, the present disclosure is not limited thereto.

The plasma treatment apparatus 3 includes a substantially cylindrical chamber 81, a susceptor 82 provided within the chamber 81, and a gas introduction part 83 provided in a sidewall of the chamber 81 and configured to introduce a treatment gas therethrough. The plasma treatment apparatus 3 further includes a planar antenna 84 including a plurality of microwave transmitting holes 84a and provided so as to face an upper opening of the chamber 81, a microwave generating unit 85 configured to generate microwaves, and a microwave transmitting mechanism 86 configured to guide the microwaves generated in the microwave generating unit 85 to the planar antenna 84.

A microwave transmitting plate 91 made of dielectric material is provided below the planar antenna 84. A shield member 92 is provided above the planar antenna 84. The shield member 92 has a water-cooled structure. Moreover, a wave-delaying member made of a dielectric material may be installed on an upper surface of the planar antenna 84.

The microwave transmitting mechanism 86 includes a waveguide 101 extending horizontally so as to guide the microwave from the microwave generating unit 85, a coaxial waveguide 102 including an inner conductor 103 and an outer conductor 104 extending upward from the planar antenna 84, and a mode conversion mechanism 105 provided between the waveguide 101 and the coaxial waveguide 102. Reference symbol 93 designates an exhaust pipe.

A high-frequency power supply 106 for introducing ions is connected to the susceptor 82.

In the plasma treatment apparatus 3, the microwaves generated in the microwave generating unit 85 are guided to the planar antenna 84 in a specified mode through the microwave transmitting mechanism 86 and are uniformly supplied into the chamber 81 through the microwave transmitting holes 84a of the planar antenna 84 and the microwave transmitting plate 91. The treatment gas supplied from the gas introduction part 83 is converted into plasma by the microwaves thus supplied. The insulating film formed on the wafer W is plasma-treated by active species (e.g., radicals) existing in the plasma. An $N_2$ gas is used as the treatment gas.

<Configuration Example of Crystallization Treatment Apparatus 4>

Figure 15:
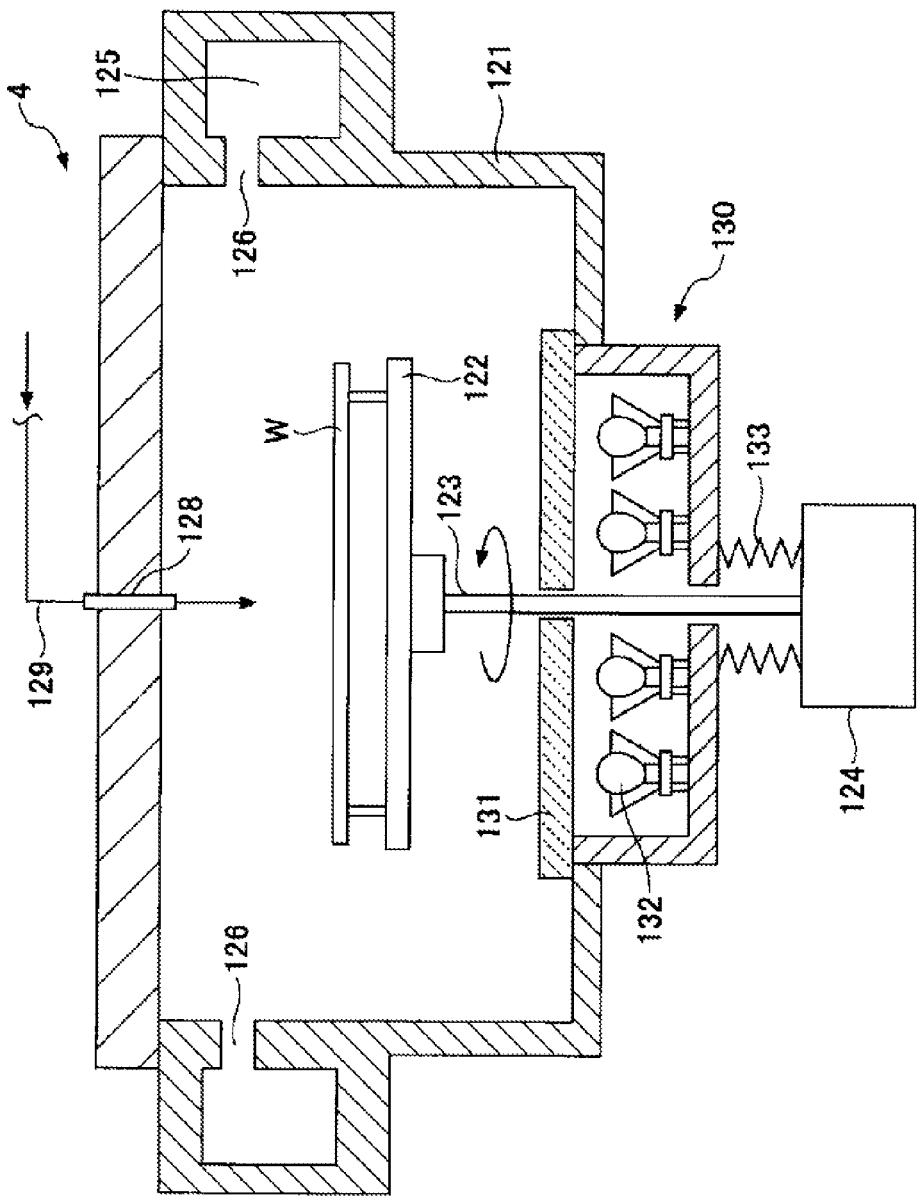
FIG. 15 is a schematic diagram illustrating a configuration example of a crystallization treatment apparatus according to an embodiment of the present disclosure.

Next, a crystallization treatment apparatus 4 for implementing a crystallization heat treatment will be described with reference to FIG. 15. FIG. 15 is a schematic diagram illustrating a configuration example of the crystallization treatment apparatus 4 according to an embodiment of the present disclosure.

The crystallization treatment apparatus 4 shown in FIG. 15 is configured as an RTP apparatus that makes use of lamp heating. The crystallization treatment apparatus 4 is configured to implement spike annealing on the insulating film of the present embodiment. The crystallization treatment apparatus 4 includes a hermetically-sealed chamber 121 having a substantially cylindrical shape. A support member 122 configured to rotatably support the wafer W is rotatably provided within the chamber 121. A rotation shaft 123 of the support member 122 extends downward and is rotated by a rotational drive mechanism 124 disposed outside the chamber 121.

An annular exhaust path 125 is provided in the outer periphery of the chamber 121. The chamber 121 and the exhaust path 125 are connected to each other through exhaust holes 126. An exhaust mechanism (not shown) such as a vacuum pump is connected to at least one point of the exhaust path 125 and is configured to evacuate the inside of the chamber 121.

A gas introduction pipe 128 is inserted through a top wall of the chamber 121. A gas supply pipe 129 is connected to the gas introduction pipe 128. In other words, a treatment gas is introduced into the chamber 121 through the gas supply pipe 129 and the gas introduction pipe 128. A rare gas such as an Ar gas, or an $N_2$ gas, can be suitably used as the treatment gas.

A lamp room 130 is provided in the bottom portion of the chamber 121. A light transmitting plate 131 made of transparent material such as quartz is provided on an upper surface of the lamp room 130. A plurality of heating lamps 132 configured to heat the wafer W are provided within the lamp room 130. A bellows 133 is provided between the bottom surface of the lamp room 130 and the rotational drive mechanism 124 so as to surround the rotation shaft 123.

In the crystallization treatment apparatus 4, the wafer W is first carried into the chamber 121. Then, the inside of the chamber 121 is evacuated to be in a specified vacuum state. Thereafter, while introducing the treatment gas into the chamber 121, the wafer W is rotated through the support member 122 by the rotational drive mechanism 124 and is rapidly heated by the heating lamps 132 of the lamp room 130. When the wafer W reaches a predetermined temperature, the heating lamps 132 are turned off to rapidly cool the wafer W. Thus, a crystallization heat treatment can be implemented within a short period of time.

The wafer W may not be rotated. The lamp room 130 may be disposed above the wafer W. In this case, a cooling mechanism may be provided at a rear surface side of the wafer W so that the wafer W can be more rapidly cooled.

In the present embodiment, a method of treating the silicon wafer as the workpiece has been described. In other words, description has been made on an example in which the silicon wafer is treated and the gate insulating film is formed. However, the present disclosure is not limited thereto. For example, the semiconductor device manufacturing method according to the present embodiment may be applied to a method for forming a capacitive insulating film of a capacitor (capacitor capacity film) of a dynamic random access memory (DRAM).

More specifically, the insulating film of the present embodiment may be applied to a high-k film for a DRAM capacitor that usually makes use of a laminated structure which is a combination of $TiO_2$, $Al_2O_3$ and $ZrO_2$ films. The insulating film of the present embodiment may have a structure where another film is further laminated. For example, the insulating film of the present embodiment may be applied to a structure laminated with a $TiO_2$ film, a $SrTiO_3$ (STO) film or a $Ba_{0.4}Sr_{0.6}TiO_3$ (BST) film. Specifically, the present disclosure may be applied to a laminated film of the $TiO_2$ film and the insulating film of the present embodiment, a configuration in which the insulating film of the present embodiment is interposed between two $TiO_2$ films, and a structure in which the aforementioned $TiO_2$ film is substituted by the STO film and/or the BST film.

It is possible to provide a semiconductor device manufacturing method capable of enabling both the reduction of an EOT (equivalent oxide thickness) and the reduction of a leak current over a wide process temperature range.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device manufacturing method, comprising:
   forming a gate insulating film containing a mixture of a hafnium oxide film and a zirconium oxide film on a workpiece having a source, a drain and a channel; and
   subjecting the gate insulating film to a crystallization heat treatment at a temperature of 600 degrees C. or less,
   wherein the content of the hafnium oxide film in the gate insulating film is 5 mol % to 30 mol % and the gate insulating film subjected to the crystallization heat treatment has a relative permittivity of 27 or more.

2. The method of claim 1, wherein forming a gate insulating film includes forming a laminated film of the hafnium oxide film and the zirconium oxide film.

3. The method of claim 2, wherein forming a laminated film includes depositing the hafnium oxide film on the workpiece and depositing the zirconium oxide film on the hafnium oxide film, and
   subjecting the deposited hafnium oxide film to a plasma nitriding treatment between the depositing of the hafnium oxide film on the workpiece and the depositing of the zirconium oxide film on the hafnium oxide film.

4. The method of claim 1, wherein forming a gate insulating film includes depositing a hafnium zirconium oxide film.

5. The method of claim 1, wherein the content of the hafnium oxide film in the gate insulating film is 5 mol % to 10 mol % and the temperature for the crystallization heat treatment is between 450 degrees C. and 600 degrees C.

6. The method of claim 1, wherein the content of the hafnium oxide film in the gate insulating film is 10 mol % to 20 mol % and the temperature for the crystallization heat treatment is between 500 degrees C. and 600 degrees C.

7. The method of claim 1, wherein the content of the hafnium oxide film in the gate insulating film is 20 mol % to 30 mol % and the temperature for the crystallization heat treatment is between 500 degrees C. and 600 degrees C.

\* \* \* \* \*